United States Patent [19]

Schweitzer, III

[11] 4,300,182

[45] Nov. 10, 1981

[54] METERING AND PROTECTION SYSTEM FOR AN A.C. POWER SYSTEM

[76] Inventor: Edmund O. Schweitzer, III, 10 University Heights, Athens, Ohio 45701

[21] Appl. No.: 65,158

[22] Filed: Aug. 9, 1979

[51] Int. Cl.³ .............................................. H02H 3/00
[52] U.S. Cl. .................................... 361/79; 324/141; 361/65; 364/727
[58] Field of Search ...................... 361/79, 65, 80, 82, 361/85, 93; 364/727, 728, 483; 324/77 G, 83 Q, 141

[56] References Cited

U.S. PATENT DOCUMENTS 3,984,737 10/1976 Okamura et al. ............... 364/483 X
4,131,847 12/1978 Kohga et al. ...................... 324/141
4,139,878 2/1979 Shuey ................................... 361/93

OTHER PUBLICATIONS

"The Use of Walsh Functions for High-Speed Digital Relaying", John W. Horton, May 12, 1975, A 75582-7.
"Result of Field Experiments of Digital Relays . . . Microprocessor", IFAC Symposium 1977, Suzuki et al., pp. 312-316.
"Application of Walsh Transform to Statistical Analysis", IEEE Trans. vol. SMC-1, No. 2, Apr. 1971, Pearl.

*Primary Examiner*—J. D. Miller
*Assistant Examiner*—Reinhard J. Eisenzopf
*Attorney, Agent, or Firm*—Lockwood, Dewey, Alex & Cummings

[57] ABSTRACT

A system for electronically metering an A.C. electrical power system to derive performance parameters such as real and reactive power useful in revenue metering and fault protection applications. Voltage and current sensors associated with the power system provide isolated output signals proportional to the voltage and current in the system. From these signals finite-duration impulse-response filters periodically determine Walsh function correlation coefficients by integrating the voltage and current signals at least once during each period of the power system and periodically sampling and holding the integrated signal in sequence with the integration. The present and a plurality of immediately preceding correlation coefficient values are stored in memory, and by combination of the correlation coefficients by addition, subtraction or multiplication, power system performance parameters, such as real power, reactive power, voltage, current, or power factor, are obtained for utilization in revenue metering or overload protection applications. Related methods are also disclosed.

22 Claims, 21 Drawing Figures

METERING AND PROTECTION SYSTEM FOR AN A.C. POWER SYSTEM

BACKGROUND OF THE INVENTION

The present invention relates generally to a metering system for deriving performance parameters in an A.C. electrical power system, and is more particularly concerned with a system and method for deriving real and reactive power parameters in a power system for use in revenue metering and/or overload protection applications.

In revenue metering applications it has heretofore been customary to meter real and reactive power in A.C. electrical systems by means of devices which are predominantly electro-mechanical in nature, such as induction disc type watt-hour meters, which generally provide better than 1 percent accuracy and are available with accuracies approaching 0.25 percent.

Recently, with the advent of economical microprocessor devices, it has been proposed that real and reactive power measurements be accomplished by electronic means, thereby avoiding completely the need for electromechanical mechanism and achieving a reduction in physical size and cost. Previous attempts at such electronic metering, which were based on the use of analog techniques utilizing multipliers and operational amplifiers, typically were not able to duplicate the accuracy of the electromechanical watt-hour meters, especially in the wide temperature range environments encountered in A.C. power systems.

In A.C. power system circuit protection applications, wherein system parameters, such as voltage, current, and power are continuously monitored and a relay or other switch device is opened upon occurrence of a system fault, it has heretofore been customary to use electro-mechanical relays to protect machines, capacitor banks, transmission lines, transformers, reactors, distribution and transmission busses, and other power system components. Typically, each of these electro-mechanical relays has one or more current or voltage sensors, and is arranged to protect only one circuit or device in the system, so that failure of one relay does not necessarily result in loss of protection to other system components protected by other relays.

Over the past several years electronic computer-based protection systems have been developed, thus avoiding the need for each relay to have its own parameter sensor, and thereby allowing a greater degree of operational flexibility. Unfortunately, due to the cost of the computer hardware required for monitoring line conditions using presently practiced methods, the concept of using computer-based protection systems has not been economically feasible for protection of a single component with a single relay, and has been generally limited to centralized applications wherein several system components can be protected, such as all the components in a substation. Thus, the autonomy and reliability of the conventional electro-mechanical relays is lost as centralization of protection becomes necessary to make computer-based protection and monitoring economically feasible. For this reason, computer-based protection systems have not gained wide industry acceptance.

The present invention provides a metering system which is compact and economical to construct, and which overcomes the deficiencies of prior art revenue metering and fault protection circuits by providing output signals which indicate power system parameters with a high degree of accuracy and stability, in a form compatible with digital processing techniques.

Accordingly, the general object of the present invention is to provide a new and improved system and method for deriving performance parameters such as real and reactive power in an A.C. electrical power system.

A related object of the present invention is to provide digital output signals from the above system, and to utilize these signals in revenue metering and fault protection applications.

SUMMARY OF THE INVENTION

The present invention is directed to a system and method of determining the real and reactive power delivered by a power system. Voltage and current sensing devices incorporated in the system provide signals proportional to voltage and current in the power system. The proportional voltage and current signals are either filtered by low-pass filters to remove frequencies higher than that of the power system, or are integrated in integrator circuits at least once during each cycle of the power system. Sample and hold circuitry associated with each low-pass filter or integrator circuit periodically samples the filtered or integrated signals in sequency with the integration, or at least once during each cycle of the power system, and holds the sampled signal for a predetermined time interval.

Finite-duration impulse-response filters separately and repetitively determine Walsh function correlation coefficients for each proportional voltage and current signal. The finite-duration impulse-response filters include either the low-pass filters and the sample and hold circuits, or the integrators and the sample and hold circuits. One such finite-duration impulse-response filter is provided for each voltage or current signal.

The finite-duration impulse-response filters may further include analog-to-digital conversion circuitry for providing digital signals representative of the successive sampled analog signals of the sample and hold circuitry, and a digital processor adapted to store each of the successive digital signals from the analog-to-digital conversion circuitry. The digital processor may be further adapted to positively or negatively add a plurality of the successive digital signals to complete the Walsh function correlation of the proportional voltage or current signals and to determine performance-indicating parameters for the power system. Typical performance factors thus derived are real power and reactive power, as well as a number of other variables such as the voltage, current, or power factor. These factors may be visually displayed, or may be utilized in conjunction with additional circuitry to record power consumption over a period of time, as in revenue metering applications, or may be utilized in conjunction with additional circuitry to control or interrupt operation of the power system in response to the occurrence of a fault or other irregularity, as in fault protection applications.

The basic method includes the steps of sensing the A.C. electrical power system to provide output signals proportional to voltage and current in the power system, separately filtering each voltage and current signal with finite-duration impulse-response filters, as by either filtering the proportional voltage and current signals to remove frequencies higher than that of the power system, or by integrating the proportional voltage and current signals at least one during each A.C. power system cycle, sampling the filtered signal at least once during each power system cycle or sampling the integrated signal in sequency with the integration, holding the sampled signal for a predetermined time interval to derive Walsh function correlation coefficients, and combining the present and a plurality of immediately preceding correlation coefficients to determine power system performance parameters. The filtering of the finite-duration impulse-response filters may include converting the analog held signal to a digital representation, storing each successive digital representation of the held signal in a digital memory and adding the successive digital representations of the Walsh function correlation coefficients either positively or negatively to provide the desired performance parameters. The further steps of controlling or interrupting the power system upon the occurrence of a fault or other irregularity, as determined from one of the performance parameters, may be implemented.

BRIEF DESCRIPTION OF THE DRAWINGS

Features of the present invention, which are believed to be novel, are set forth with particularity in the appended claims. The invention, together with the further advantages thereof, can best be understood by reference to the following description taken in conjunction with the accompanying drawings, in the several figures in which like reference numerals identify like elements, and in which:

DESCRIPTION OF THE PREFERRED EMBODIMENTS

Figure 1:
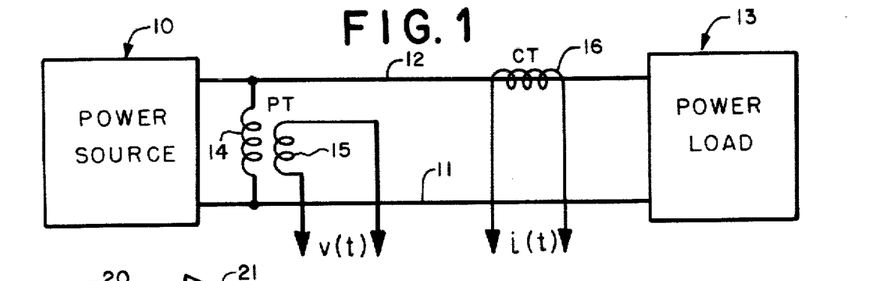
FIG. 1 is a schematic diagram, partially in block form, of a conventional two-wire, single-phase A.C. electrical power system including a power source and a load, and a potential transformer and a current transformer providing respective isolated voltage and current signals proportional to voltage and current in the power system.

With reference to FIG. 1, there is shown an alternating current (A.C.) power source, generally designated 10, adapted to deliver power via a pair of lines 11 and 12 to a load, generally designated 13. While the circuit in FIG. 1 is a single-phase, two-wire power system, it will be appreciated hereinafter that the present invention is also applicable in general to multi-line, multi-phase power systems or to a plurality of signal or multi-phase power systems. A primary winding 14 of a potential transformer PT is connected across lines 11 and 12, and a secondary winding 15 of potential transformer PT provides a scaled analog voltage signal v(t) proportional to the A.C. voltage between lines 11 and 12.

A current transformer CT is in series with one of lines 11 or 12 and a secondary winding 16 thereof provides a scaled analog current signal i(t) proportional to the A.C. current in line 12. Besides suitable scaling for further analysis by electronic circuitry, potential transformer PT and current transformer CT also provide isolation between power distribution lines 11 and 12 and the circuitry which analyzes respective signals v(t) and i(t).

It will be appreciated by those skilled in the art that other types of sensing devices may be utilized to provide voltage and current signals v(t) and i(t) proportional to those in the power system with a sufficient degree of accuracy. Other types of voltage sensors may include capacitive potential transformers, resistive voltage dividers, or electric field strength sensors. Other types of current sensors may include current shunts with isolation amplifiers, current shunts with isolation transformers, Hall-effect devices, magnetic field strength sensors or linear couplers such as air core current transformers. The primary requirements are that voltage and current sensors provide accurate proportional signals to those in the power system with a high degree of isolation between the A.C. power system and the circuitry which analyzes the proportional signals.

To better appreciate the operation of the circuitry which analyzes signals v(t) and i(t) from potential transformer PT and current transformer CT, it is helpful to first understand the theory underlying the operation of the circuitry. In the usual A.C. power system, the voltage and current signals in the system will be sinusoidal in character under steady state operation of the system. The proportional voltage and current signals v(t) and i(t) will therefore also be sinusoidal in character and may be expressed by the equations:

$$v(t) = V \sin(\omega t + \phi)$$

$$i(t) = I \sin(\omega t + \phi - \theta)$$

where V and I are the instantaneous peak values of the sinusoidal waveforms v(t) and i(t), $\phi$ is the phase angle of voltage v(t), and current i(t) lags voltage v(t) by $\theta$ radians.

Figure 3A:
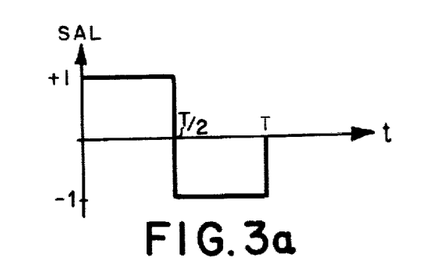
FIG. 3a is a graphical depiction of a Walsh function useful in explaining the operation of the systems of FIGS. 2a and 2b.
Figure 3B:
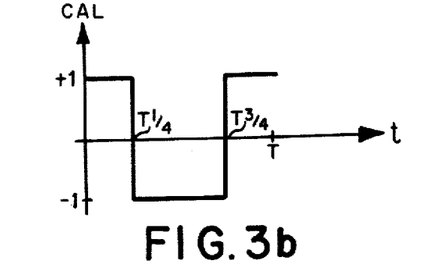
FIG. 3b is a graphical depiction of another Walsh function, in quadrature relationship to the Walsh function in FIG. 3a, useful in explaining the operation of the systems of FIGS. 2a and 2b.

Under the teachings of the present invention, power system performance, including voltage, current, real power, reactive power and power factor, can be determined by correlation of the signals v(t) and i(t) with so-called Walsh functions. The Walsh function SAL(t) is shown in FIG. 3a and another Walsh function CAL(t) is shown in FIG. 3b. SAL(t) and CAL(t) are preferably square waves of unity amplitude and in quadrature relationship with each other. It is also important that the period of the SAL(t) and CAL(t) functions equal the periods of the signals v(t) and i(t) for simplification of the correlation. As will be better appreciated hereinafter, the amplitude of SAL(t) and CAL(t) is unity for further simplification of the correlation. However, other amplitudes may be chosen for scaling purposes if such is desired.

The correlation of v(t) with SAL(t) is given by $$S_V = \int_0^{T = \frac{2\pi}{\omega}} v(t) SAL(t) dt$$

$$= \int_0^{\frac{T}{2} = \frac{\pi}{\omega}} V \sin(\omega t + \phi)[+1] dt +$$

$$\int_{\frac{T}{2} = \frac{\pi}{\omega}}^{T = \frac{2\pi}{\omega}} V \sin(\omega t + \phi)[-1] dt$$

$$= \frac{4V}{\omega} \cos \phi$$

Similarly, the correlation of CAL(t) with v(t) is given by $$C_V = \int_0^T v(t) CAL(t) dt = \frac{4V}{\omega} \sin \phi$$

The results of the Walsh function correlations of SAL(t) and CAL(t) with i(t) can similarly be shown to be:

$$S_I = \frac{4I}{\omega} \cos(\phi - \theta)$$

$$C_I = \frac{4I}{\omega} \sin(\phi - \theta)$$

Figure 2A:
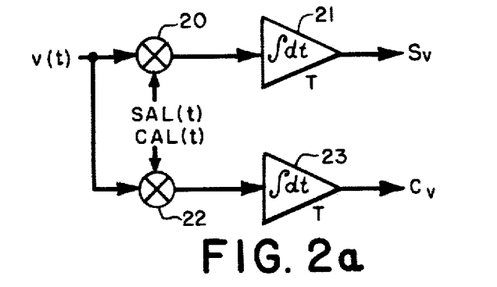
FIG. 2a is a functional block diagram of a system constructed in accordance with one aspect of the present invention for determining the Walsh function correlation coefficients for the proportional voltage provided by the circuitry of FIG. 1.

The correlation of v(t) with Walsh functions SAL(t) and CAL(t) is shown diagrammatically in FIG. 2a. An analog multiplier 20 multiplies v(t) and SAL(t) and the product of multiplier 20 is integrated over the period T by an integrator 21 to yield a Walsh correlation coefficient quantity $S_V$. In a similar manner, an analog multiplier 22 multiplies v(t) with CAL(t) and the product of multiplier 22 is integrated over period T by an integrator 23 to yield a Walsh correlation coefficient $C_V$.

Figure 2B:
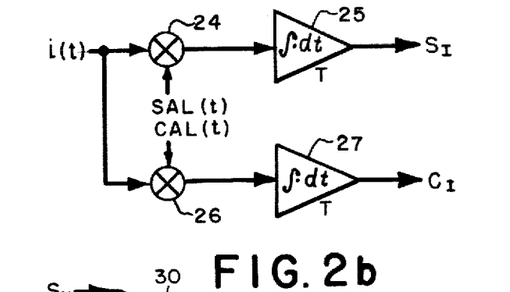
FIG. 2b is a functional block diagram of a system constructed in accordance with one aspect of the present invention for determining the Walsh function correlation coefficients for the proportional current provided by the circuitry of FIG. 1.

In a like manner, a Walsh correlation coefficient $S_I$ is determined in FIG. 2b. An analog multiplier 24 multiplies i(t) with SAL(t) and this product is integrated over period T by an integrator 25. A Walsh correlation coefficient $C_I$ is determined by multiplying i(t) with CAL(t) by an analog multiplier 26 and integrating the multiplier product over period T by an integrator 26.

Figure 4:
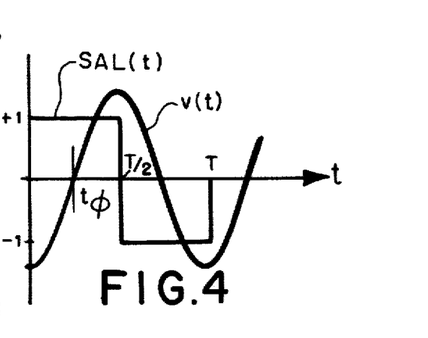
FIG. 4 is a graphical depiction of the correlation of a Walsh function with a sinusoidal voltage or current waveform in accordance with the present invention.

A correlation of v(t) with SAL(t) is shown graphically in FIG. 4 where the sinusoidal voltage waveform v(t) leads the Walsh function SAL(t) by a time $T_\phi$ associated with a phase angle $\phi$.

For the purpose of convenience, define $A = S_V S_I$ and $B = C_V C_I$. Then, $$A = \left(\frac{4}{\omega}\right)^2 VI \cos \phi (\phi - \theta)$$

$$= \left(\frac{4}{\omega}\right)^2 VI (\cos^2\phi \cos \theta + \cos \phi \sin \phi \sin \theta)$$

and $$B = \left(\frac{4}{\omega}\right)^2 VI (\sin^2\phi \cos \theta - \cos \phi \sin \phi \sin \theta)$$

Therefore, $$A + B = \left(\frac{4}{\omega}\right)^2 VI (\sin^2\phi \cos \theta + \cos^2\phi \cos \theta)$$

$$= \left(\frac{4}{\omega}\right)^2 VI \cos \theta$$

But it will be recalled that for a sinusoidal power system that the real power P delivered by the system is related to the instantaneous peak voltage V and current I by the equation:

$$P = \frac{VI}{2} \cos \theta$$

so, $$P = \frac{1}{2}(A + B)\left(\frac{\omega}{4}\right)^2 = \frac{1}{2}\left(\frac{\omega}{4}\right)^2 [S_V S_I + C_V C_I]$$

By similar means, it can be shown that the reactive power Q delivered by the power system is given by the equation $$Q = \frac{1}{2}\left(\frac{\omega}{4}\right)^2 [C_V S_I - S_V C_I]$$

Figure 5A:
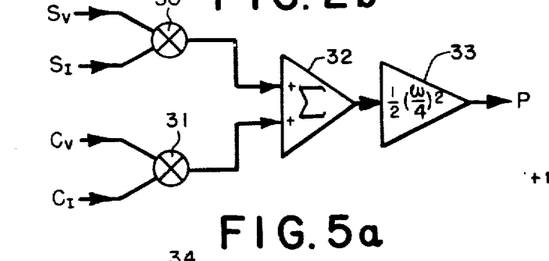
FIG. 5a is a functional block diagram of a system for combining the Walsh function correlation coefficients, as from FIGS. 2a and 2b, to determine the real power p delivered by the electrical power system of FIG. 1.

Circuitry for determining the real power P from the Walsh correlation coefficient products $S_V S_I$ and $C_V C_I$ by analog means is diagrammatically illustrated in FIG. 5a. Coefficients $C_V$ and $S_I$ are multipled by an analog multiplier 30. Similarly, coefficients $C_V$ and $C_I$ are multiplied by another analog multiplier 31. The products of multipliers 30 and 31 are summed by a summing amplifier 32 and a scaling amplifier 33 provides the appropriate scaling factor in accordance with the previous equations.

Figure 5B:
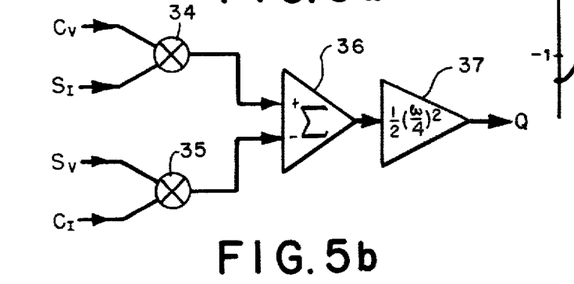
FIG. 5b is a block diagram similar to FIG. 5a, but for combining the Walsh function correlation coefficients, as from FIGS. 2a and 2b, to determine the reactive power Q delivered by the electrical power system of FIG. 1.

In a similar manner reactive power Q can be determined from the Walsh correlation coefficients by analog circuitry, as in FIG. 5b. An analog multiplier 34 multiplies coefficients $C_V$ and $S_I$. Another analog multiplier 35 multiplies coefficients $S_V$ and $C_I$. A summing amplifier 36 positively and negatively sums the products of repsective multipliers 34 and 35 and a scaling amplifier 37 supplies an appropriate scaling factor to the summation of amplifier 36 to provide an output indicative of reactive power Q.

Walsh function correlation with either v(t) or i(t) can also be effected by integrating respective signals v(t) or i(t) a plurality of times during each power system cycle and appropriately positively or negatively summing each of the plurality of integration results occurring during the cycle. For example, CAL(t) correlation with voltage signal v(t) can be easily broken down into one-fourth cycle integrals as shown by the following expression:

$$C_V = \int_0^{T/4} v(t)dt - \int_{T/4}^{T/2} v(t)dt - \int_{T/2}^{3T/4} v(t)dt + \int_{3T/4}^{T} v(t)dt$$

$C_V$ may therefore be determined by appropriate positive or negative summation of the one-fourth cycle integrals of v(t) with CAL(t).

Figure 6A:
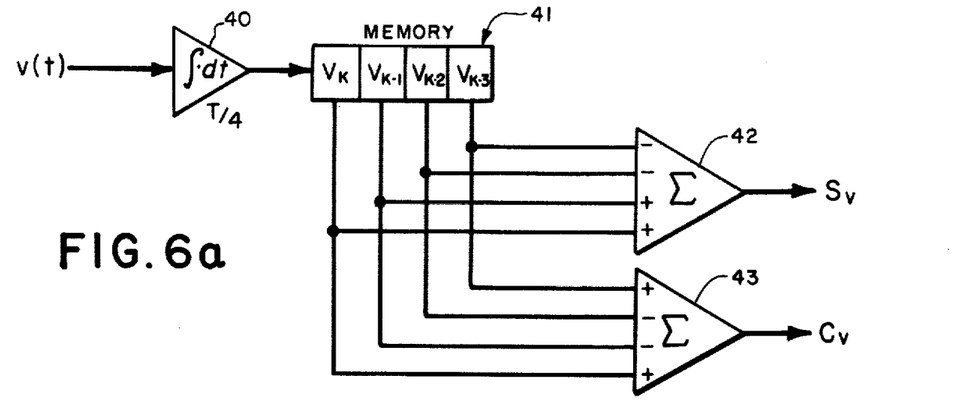
FIG. 6a is a block diagram of an alternate system for determining the Walsh function correlation coefficients for the proportional voltage signal provided by the circuitry of FIG. 1.
Figure 6B:
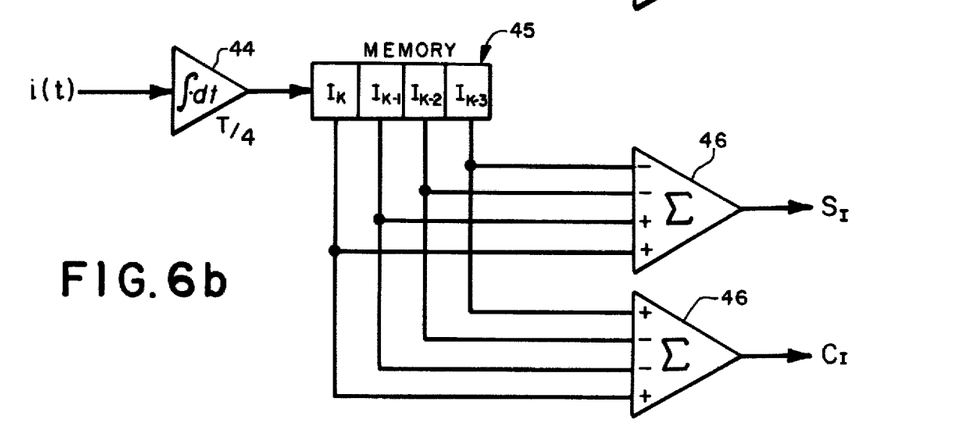
FIG. 6b is a block diagram similar to FIG. 6a, but adapted to determine the Walsh function correlation coefficients for the proportional current signal of FIG. 1.

Circuitry may be implemented for determining the Walsh function correlation coefficients for v(t) and i(t) as shown diagrammatically in FIGS. 6a and 6b. Proportional signals v(t) and i(t) are separately integrated over each quarter period of the power system cycle, e.g. T/4 seconds. Thus, signal v(t) or i(t) is sampled four times during each cycle of the power system, and each voltage sample may be expressed as $$V_K = \int_{KT/4}^{(K+1)T/4} v(t)dt$$

and each current sample may be expressed as $$I_K = \int_{KT/4}^{(K+1)T/4} i(t)dt$$

The Walsh function correlation coefficients for v(t) may then be expressed as $$S_V = (V_K + V_{K-1}) - (V_{K-2} + V_{K-3})$$
$$C_V = V_K - (V_{K-1} + V_{K-2}) + V_{K-3}$$

Similarly, Walsh function correlation coefficients $S_I$ and $C_I$ may be expressed as $$S_I = (I_K + I_{K-1}) - (I_{K-2} + I_{K-3})$$
$$C_I = I_K - (I_{K-1} + I_{K-2}) + I_{K-3}$$

FIGS. 6a and 6b diagrammatically show circuitry for determining Walsh function correlation coefficients for proportional signals v(t) and i(t). Signal v(t) is integrated over a quarter-cycle by integrator 40 with a memory 41 storing successive integration results for each of four prior quarter-cycles. A summing means 42 positively or negatively sums each of prior integration results $V_K$, $V_{K-1}$, $V_{K-2}$, $V_{K-3}$ to determine correlation coefficient $S_V$. Similarly, another summing means 43 positively or negatively sums each of the prior quarter-cycle integration results to determine correlation quantity $C_V$. The polarity of the summing inputs on summing means 42 and 43 are selected to effectively apply the $\pm 1$ multiplying factor, i.e. the $\pm 1$ amplitude of correlation functions SAL(t) and CAL(t) shown in FIGS. 3a and 3b, such that no separate multiplication of Walsh functions SAL(t) or CAL(t) is needed before integration of signals v(t) or i(t). Instead, the Walsh function correlation is effectively provided by selecting the polarity of summation of the individual quarter-cycle integration results.

Signal i(t) is correlated in a related manner in FIG. 6b by an integrator 44, a memory 45, a summing means 46, and a summing means 47 to respectively determine correlation coefficients $S_I$ and $C_I$. Correlation quantities $S_V$, $C_V$, $S_I$ and $C_I$ may then be utilized, as by circuitry diagrammatically illustrated in FIGS. 5a and 5b, to determine the real or reactive power delivered by the power system or to protect or control the power system.

The Walsh function correlation coefficients can also be determined by low-pass filtering followed by impulse sampling for similarly determining the per cycle real power P or reactive power Q. However, since the real or reactive power may not be required for each and every cycle in many applications, an averaging process can be also used to determine the Walsh function correlation coefficients. For example, the correlation coefficients can be averaged over a period of 60 cycles, as by averaging 60 values of the correlation coefficients as determined on a per cycle basis. The average values of each of the correlation coefficients may then be used to determine the desired power system performance parameter. The advantages of averaging are that if the particular parameter is not needed once every second, then it is not necessary to determine the parameter that often and the circuitry may be free to perform other measurement, monitoring, or processing functions. Secondly, averaging also minimizes possible quantization and noise errors. Thirdly, the four multiplications need be performed only once per averaging period, instead of every cycle. This enhances computational efficiency.

Figure 7A:
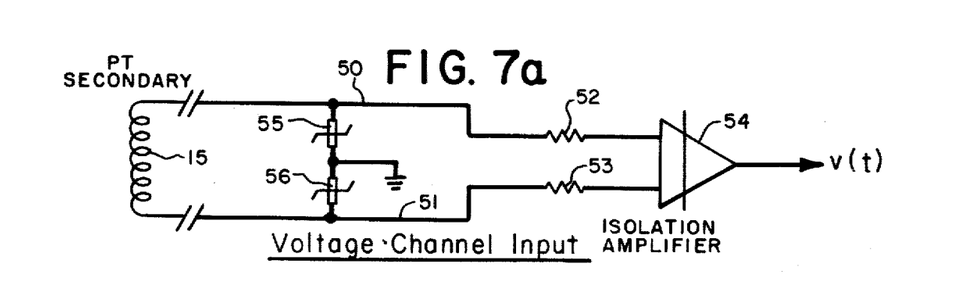
FIG. 7a is a simplified electrical schematic diagram of a voltage sensor for sensing voltage in the electrical power system of FIG. 1 to provide an isolated and proportional voltage output signal.

The preferred embodiment of the circuitry to accomplish the Walsh function correlations of proportional signals v(t) and i(t) and the desired metering and protective functions is illustrated in FIGS. 7a, 7b and 9 through 16. In FIG. 7a is shown that portion of the circuitry which produces isolated and proportional voltage signal v(t). Potential transformer secondary winding 15 is fed via a pair of lines 50 and 51 through a pair of respective current limiting resistors 52 and 53 to input terminals of an isolation amplifier 54. A voltage transient suppressor 55 is connected between line 50 and ground and another voltage transient suppressor 56 is similarly connected between line 51 and ground to protect the inputs of amplifier 54 from unusual voltage transients which may occur in the A.C. power system. The output of amplifier 54 provides signal v(t).

Figure 7B:
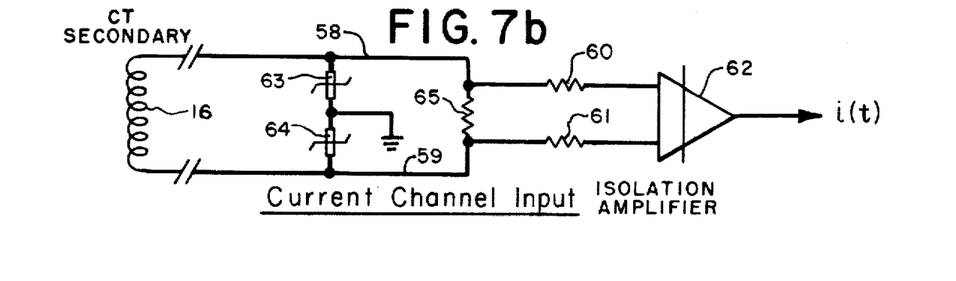
FIG. 7b is a simplified electrical schematic diagram of a current sensor for sensing current in the electrical power system of FIG. 1 to provide an isolated and proportional current output signal.

In a similar manner, current transformer secondary winding 16 is fed via a pair of lines 58 and 59 through a pair of respective current limiting resistors 60 and 61 to the inputs of another isolation amplifier 62, the output of which produces isolated and proportional current signal i(t). A pair of voltage transient suppressors 63 and 64 removes voltage transients from the respective lines 58 and 59 to protect the inputs of amplifier 62. The main difference between the circuit of FIG. 7b from that of FIG. 7a is a shunt resistor 65 between lines 58 and 59, which provides a path for current in secondary winding 16 to create a potential across resistor 65 proportional to the power system current. The circuits in FIGS. 7a and 7b provide proportional signals v(t) and i(t) for a single-phase power system. It will be understood that in multi-phase power systems that each phase of the power system will be provided with separate circuits similar to those in FIGS. 7a and 7b.

Figures 10, 11:
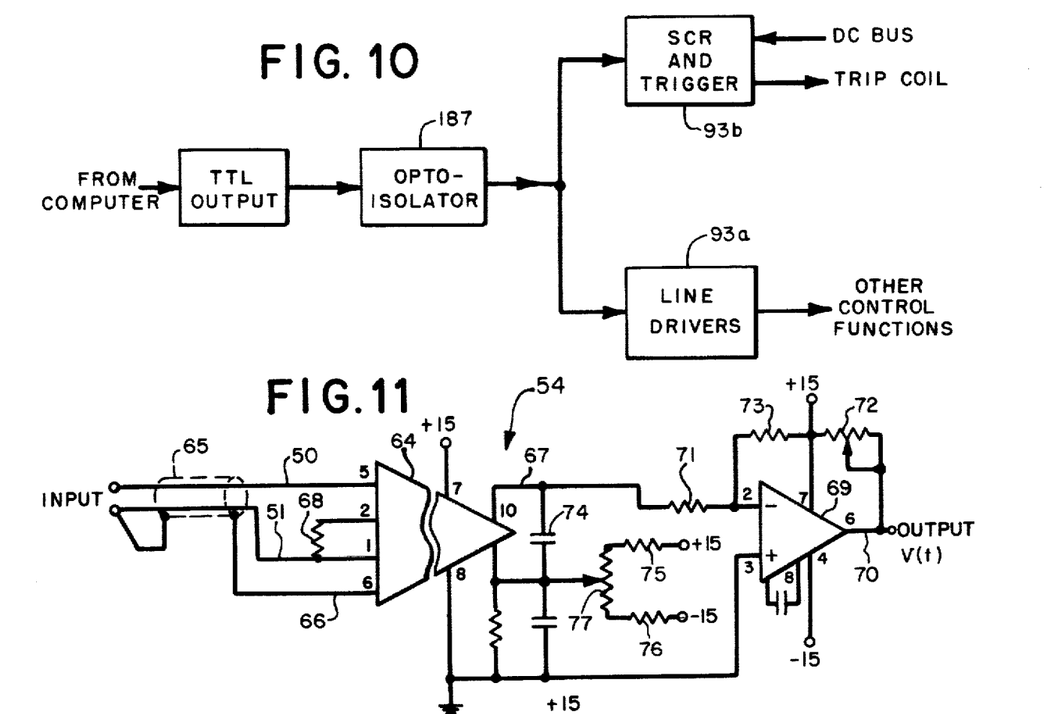
FIG. 10 is a simplified functional block diagram of a digital electronic relay responsive to the digital control outputs of the systems of either FIGS. 8 and 9.
FIG. 11 is a schematic diagram of one form of isolation amplifier useful in the circuitry of FIGS. 7a and 7b.

Shown in greater detail in FIG. 11 is isolation amplifier 54 of FIG. 7a, or alternatively, isolation amplifier 62 of FIG. 7b since amplifiers 54 and 62 may be identical. Lines 50 and 51 between potential transformer secondary winding 15 and input terminals of an isolation amplifier module 64 are preferably in the form of a twisted-pair cable with a shielding 65 for optimum common-mode rejection of electrical noise or the like. Shielding 65 is connected to a guard terminal 66 of amplifier 64. Isolation amplifier module 64 electrically isolates lines 50 and 51 from an output line 67 by means of magnetic or optical coupling, such as in isolation amplifier module model AD284J, which is commercially available from Analog Devices, Inc. of Norwood, Mass. A resistor 68 across a pair of terminals of module 64 determines the gain thereof. If no resistor 68 is used, module 64 has unity gain and the frequency response is not degraded. A capacitor 74 connected to output line 67 in combination with the output impedance of module 64 provides a single-pole low-pass filter having a bandwidth at least several times the power system frequency such that the overall bandwidth of downline electrical circuitry is not adversely affected, for example a 400 Hertz bandwidth for a 60 Hertz power system frequency.

Since the output impedance of module 64 is about 1,000 ohms, a buffer amplifier 69 is utilized to provide a lower impedance signal v(t) on an output line 70 than is available on output line 67. Amplifier 69 is commercially available, for example, from National Semiconductor Company of Santa Clara, Calif., as part number LM308AN. A resistor 71 in series with output line 67 is connected to the inverting input of amplifier 69, which does not appreciably load line 67. An adjustable resistor 72 in series connection with a fixed resistor 73 between output line 70 and the inverting input of amplifier 69 adjusts the gain of amplifier 69 at about unity gain. A resistive voltage divider, including a pair of resistors 75 and 76 and an adjustable resistor 77, compensate for any nonzero voltage offset in either amplifier 69 or module 64.

Figure 8:
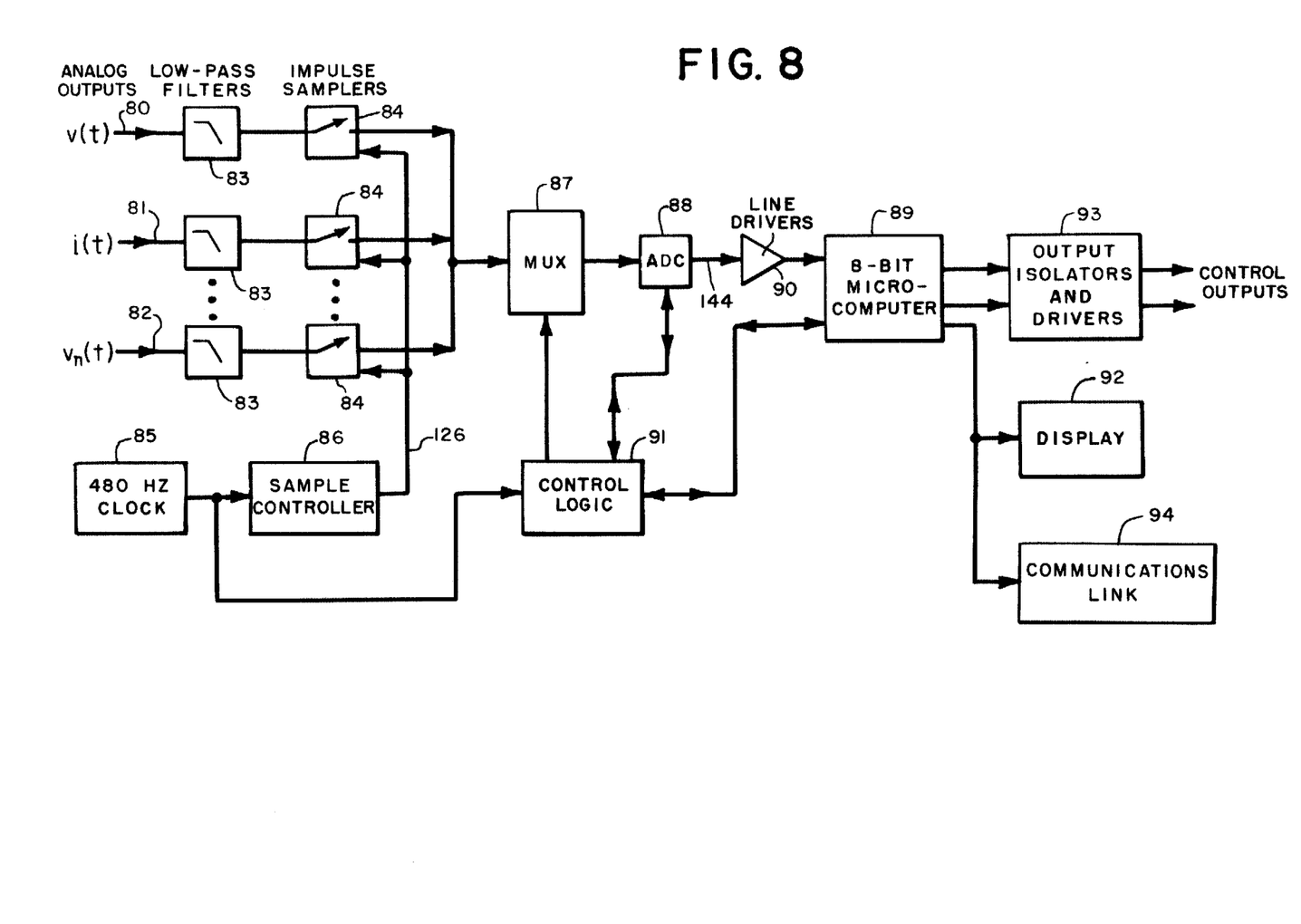
FIG. 8 is a functional block diagram of the present invention for monitoring a system constructed in accordance with and protecting the electrical power system of FIG. 1 wherein finite-duration impulse-response filtering of the proportional voltage and current output signals of FIGS. 7a and 7b is incorporated to provide digital control outputs and to display the performance of the power system.

One embodiment of the circuitry for analyzing proportional signals v(t) and i(t) is shown in block diagram of FIG. 8. A plurality of input channel lines 80, 81, and 82 for analog signals v(t) and i(t) are provided with a total of 2n channels, with the additional channels not shown in FIG. 8 indicated by the dots between channels 81 and 82. For example, 2n may be equal to 18 and thereby provide nine input channels for nine signals v(t) and nine input channels for nine signals i(t). The circuitry of FIG. 8 may thereby simultaneously meter and monitor a plurality of multi-phase power systems, or single-phase power systems, or subcircuits thereof. Each input channel 80, 81 or 82 has a series combination of a low-pass filter 83 and a sample and hold circuit 84 to periodically sample the output of low-pass filter 83. A clock 85 provides the circuitry timing signals and a sample controller 86 controls sample and hold circuits 84 in accordance with the sequency of clock 85. A multiplexer 87 makes it possible to process and analyze the signals v(t) and i(t) from a total of 2n channels 80, 81 and 82 such that the circuitry downline of multiplexer 87 need not be duplicated for each of the 2n channels. Alternatively, those skilled in the art will appreciate that separate analog-to-digital converters could be used in each channel, followed by digital multiplexing or by multiple input ports to a microcomputer or the like.

Output of multiplexer 87 is connected to an input of an analog-to-digital converter 88. Output of converter 88 is interfaced to a micro-computer 89 through a plurality of line drivers 90. The interface between analog-to-digital converter 88 and microcomputer 89 may be either by way of parallel I/O ports in conjunction with external control logic 91 for controlling the timing between multiplex sampling and conversion, with buffering provided by the I/O port line drivers 90. Alternately, multiplexer 87 and converter 88 may be treated as memory-mapped I/O such that a minimal amount of external control hardware is required, but multiplexer 87 and converter 88 must then be treated as slow memory and speeding up the I/O process is difficult. Analysis of the data from the processing of signals v(t) and i(t) by computer 89 may then be provided on a display device 92 which may take the form of any of a number of visual displays, such as digital readouts, or printing devices or the like. For example, where the circuitry is being utilized as a time overcurrent relay, in addition to displaying the parameters being metered, display 92 may provide information such as pickup, trip time, average current present at trip time, and fault type including the phase or phases involved. The outputs of microcomputer 89 may also be utilized by a plurality of output isolators and drivers 93 for various power system control or protective functions. Outputs or information from microcomputer 89 may optionally be sent to a remote location or information may be received from such remote location via a communcations link 94, such as a teletypewriter terminal, microwave transmitter, telephone line, or the like.

Figure 12:
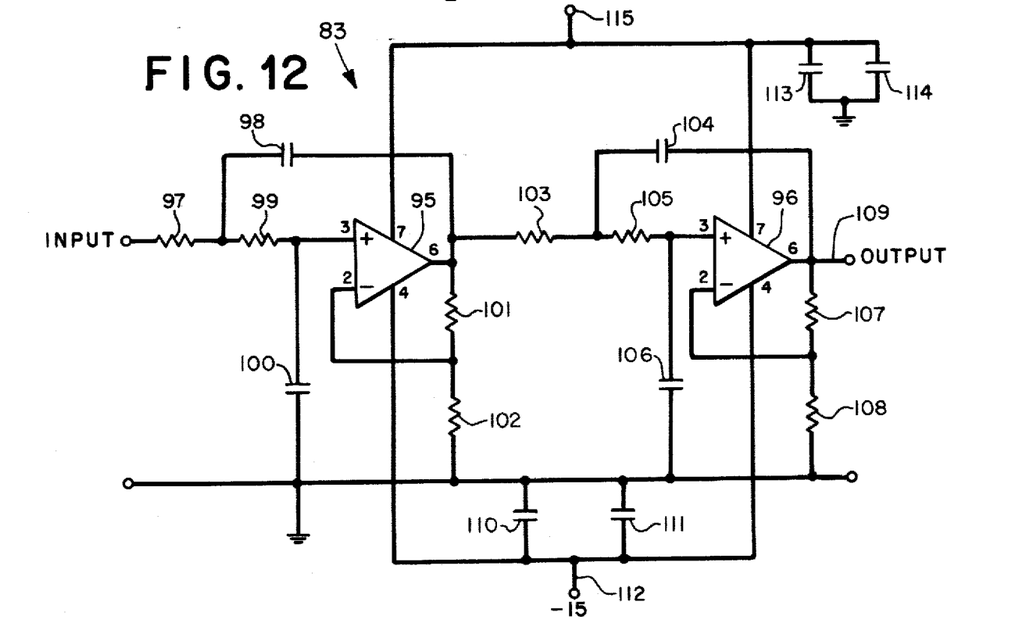
FIG. 12 is a schematic diagram of one form of low-pass filter useful in the system shown in FIG. 8.

The low-pass filter 83 used in each of input channels 80, 81 and 82 of the circuitry in FIG. 8 is shown in FIG.

12. Filtering of signals v(t) and i(t) is required under the Nyquist criterion to prevent errors which might otherwise occur if the inputs have components at frequencies greater than one-half the sampling rate of sample and hold circits 84. For example, for a clock frequency of 480 Hertz, the Nyquist frequency is 240 Hertz. Lowpass filters 83 may therefore typically have a $-3$ db cutoff frequency at about 167 Hertz and provide better than 20 db attenuation at the Nyquist frequency of 240 Hertz. Filters 83 are of the four-pole Chebyshev type having 0.5 db bandpass ripple. Each filter 83 has a pair of operational amplifiers 95 and 96, which are commercially available from a number of semiconductor manufactures, including National Semiconductor Company as part number LM307N. Amplifier 95 has a filter network comprising resistor 97, capacitor 98, resistor 99 and capacitor 100. A pair of resistors 101 and 102 establish the D.C. voltage gain of amplifier 95 at 2. Another filter network comprising resistor 103, capacitor 104, resistor 105, and capacitor 106 is interposed substantially between the output of amplifier 95 and the noninverting input of amplifier 96. A pair of resistors 107 and 108 similarly establish the D.C. voltage gain of amplifier 96 at 2 for a net input-to-output filter gain of 4. Amplifiers 95 and 96 are used in the non-inverting voltagecontrolled voltage source configuration. No voltage offset adjustments are needed since the LM307N amplifier is an internally compensated device with very low input currents and voltages. A pair of capacitors 110 and 111 provide filtering of a negative voltage supply at a terminal 112 and a pair of capacitors 113 and 114 similarly provides filtering of a positive voltage supply at a terminal 115. An output terminal 109 of amplifier 96 thereby provides a low-pass filtered signal v(t) or i(t) for presentation to sample and hold circuits 84.

Figure 13:
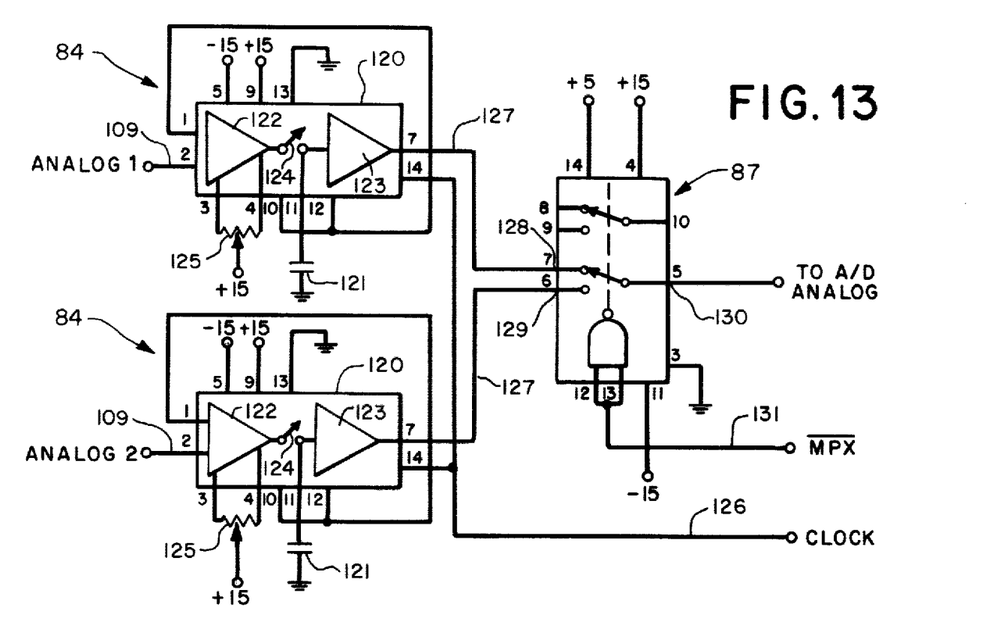
FIG. 13 is a schematic diagram of one form of impulse sampler circuit useful in the systems shown in FIGS. 8 and 9.

Sample and hold circuits 84 and multiplexer 87 are illustrated in further detail in FIG. 13. Each sample and hold circuit 84 primarily comprises an intergrated circuit 120 commercially available, for example, from Analog Devices as part number AD583K. Integrated circuit 120 consists of two high performance operational amplifiers separated by an analog switch 124. An external holding capacitor 121 is connected to the output of switch 124. Capacitor 121 is preferably a low leakage type for best voltage holding accuracy. Switch 124 is responsive to a clock signal on a clock line 126. A resistor 125, external to circuit 120, compensates for voltage offset. Since the output of circuit 120 on a line 127 is fed back into an input of amplifier 122, circuit 120 behaves as a unity-gain non-inverting amplifier in the track mode. With switch 124 closed, the output on line 127 tracks the input from low-pass filter 83 on line 109 in the sample or track mode. When switch 124 opens, the ouput on line 127 is equal to the voltage across holding capacitor 121 and circuit 120 is in the hold mode.

Multiplexer 87 is commercially available from National Semiconductor Company as part number AH0014D. Multiplexer 87 periodically selects the filtered and sampled signals v(t) and i(t) which are fed via lines 127 directly from a pair of sample and hold circuits 84 to separate input terminals 128 and 129 of multiplexer 87. An output terminal 130 of multiplexer 87 is directly connected to analog-to-digital converter 88. Multiplexer 87 selects a different input 128 or 129 under the influence of a multiplexing signal on a line 131.

Figure 15:
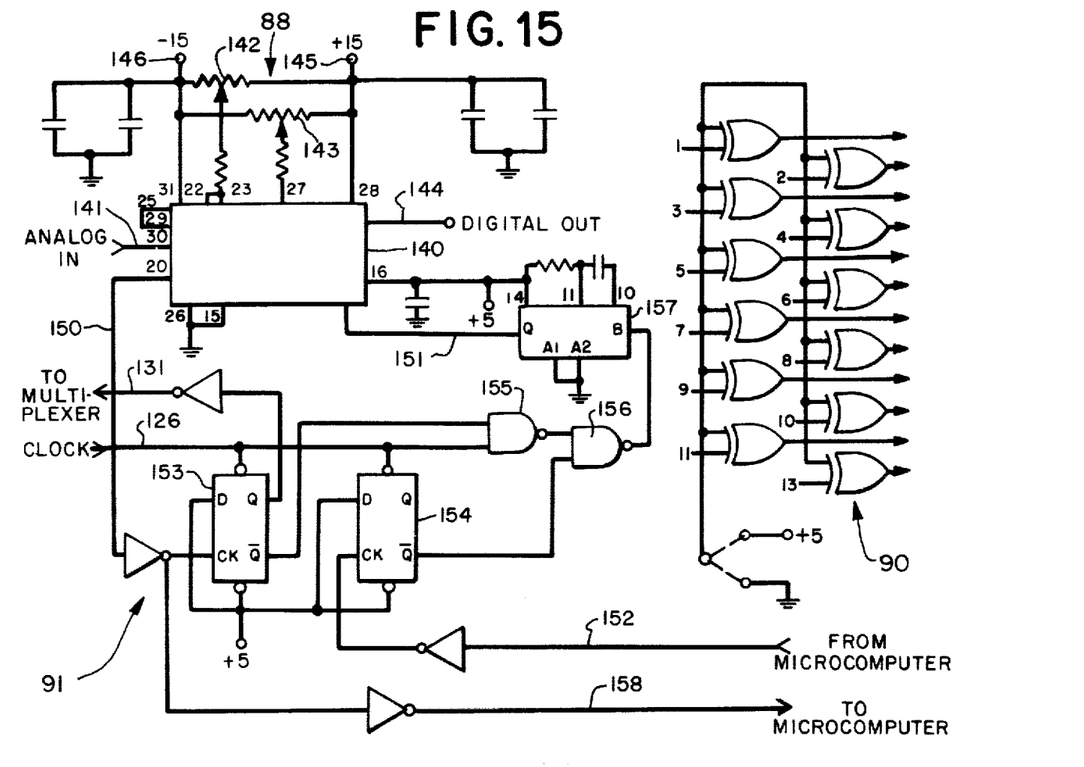
FIG. 15 is a schematic diagram of an analog-to-digital converter, line driver and control logic circuit useful in the systems of FIGS. 8 and 9.

With reference to FIG. 15, analog-to-digital converter 88, control logic 91, and line drivers 90 are shown in greater detail. The heart of converter 88 is an analog-to-digital converter circuit 140 and is, for example, commercially available from Datel Systems, Inc. of Canton, Mass. as part number ADC-HX12BGC. An input line 141 receives the multiplexed signal from output terminal 130 of multiplexer 87. A potentiometer 142 connected between a positive and a negative voltage supply terminal 145 and 146, respectively, provides a voltage offset adjustment and another potentiometer 143 also connected between terminals 145 and 146 provides a gain adjustment for circuit 140. Circuit 140 provides a digital output of 12 bits in 2's complementary binary form on 12 parallel lines, which are shown in FIGS. 8, 9 and 15 as a single line 144 for convenience.

Control logic 91 controls multiplexer 87, analogtodigital converter 88 and micro-computer 89 by generating appropriate control and sequence signals from the clock signal on line 126. For example, the following sequence of events would be generated by control logic 91 where it is desired to take 240 samples per second of each signal v(t) or i(t), i.e. 4 samples per power system cycle. When the clock signal on line 126 is in a low state, a flip flop 153 and another flip flop 154 are both cleared. The multiplexer signal on line 131 is then high causing multiplexer 87 to sample the channel at input terminal 128. When the clock signal goes high, the output of NAND gate 155 drops, causing the output of another NAND gate 156 to rise. This output transition in gate 156 fires a oneshot multi-vibrator 157 to produce a 150 nanosecond output pulse on a line 151. It is important that the width of the pulse on line 151 be greater than the 100 nanosecond maximum amount of time for circuit 140 to clear and to initiate analog-to-digital conversion. While line 151 is high, converter 88 is being cleared and when line 151 drops, conversion begins. Output line 150 of circuit 140 goes high 100 nanoseconds after line 151 drops, and indicates that conversion is beginning. When the 20 microsecond analog-to-digital conversion time is completed, line 150 goes low. This signals the computer via line 158 that valid data exists on output lines 144 of circuit 140. The transition in line 150 also changes the output state of flip flop 153 to cause multiplexer 87 to switch to the channel at input terminal 29 until flip flop 153 is cleared when the clock signal on line 126 drops. Meanwhile, computer 89 is reading 2 bytes of converter output data from converter 88 into memory. When computer 89 is finished, it informs control logic 91 by pulsing line 152 which causes flip flop 154 to be set. The change of state in flip flop 154 causes the output of NAND gate 156 to rise to in turn fire multi-vibrator 157 so that analog-to-digital conversion of the channel at input terminal 129 of multiplexer 87 begins. When conversion if finished, line 150 drops and is detected by the computer via line 158. Computer 98 reads the output of converter 88. Eventually, the clock signal drops to clear both flip flops 153 and 154, causing multiplexer 87 to reset to input 128 and enabling multivibrator 157 to respond to the next positive transition from gate 156.

Figure 14:
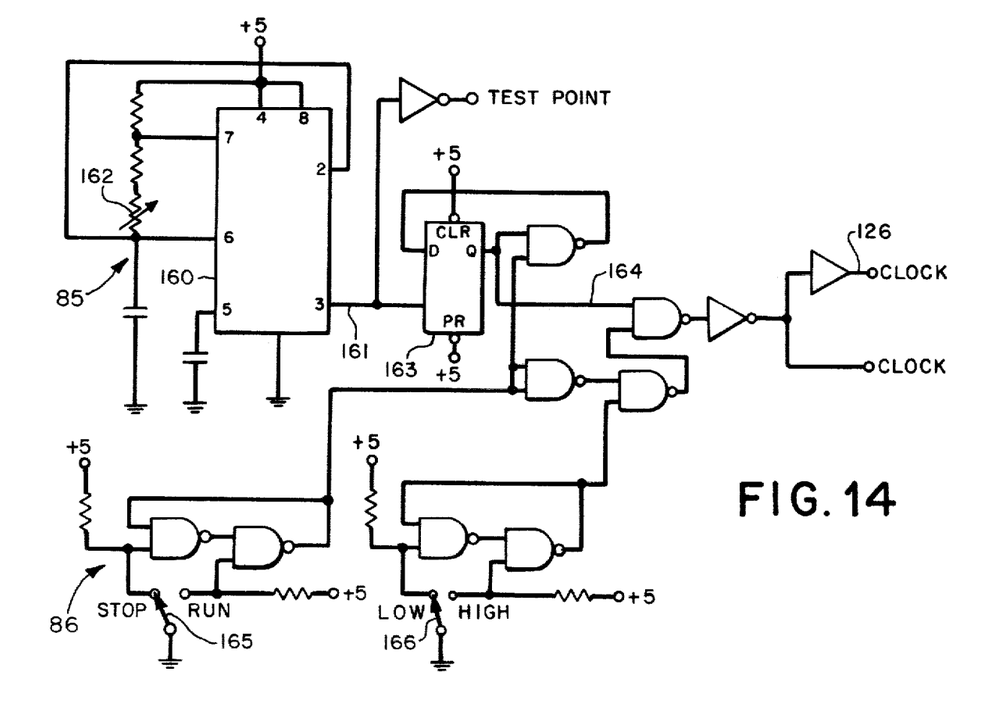
FIG. 14 is a schematic diagram of one form of clock and sample controller useful in the systems of FIGS. 8 and 9.

The clock 85 of FIG. 14 provides a 240 Hertz sampling rate with a duty cycle of about 50%. The clock frequency is determined by a free-running oscillator utilizing a timer circuit 160 commercially available from a number of semiconductor manufacturers as a "555 Timer", including the Signetics Corporation of Sunnyvale, Calif. Circuit 160 provides an output signal on a line 161 of nominally 480 Hertz, i.e. twice the sampling or clock frequency. The frequency is adjustable over a narrow range, as for calibration, by a trimming resistor 162 associated with circuit 160. The signal on line 161 is an assymetrical rectangular waveform and a flip flop 163 converts the signal to a square wave with a 50% duty cycle and 240 Hertz frequency on an output line 164. Other suitable clocks include crystal-controlled oscillators, and phase-locked loop designs. The latter derive a clock signal which is locked in phase and frequency with one of the input signals.

Sample controller 86 permits control of the clock signal at line 126 to operate in three different output modes: run, stop low, and stop high. A switch 165 allows manual control of clock output line 126 between the stop or run modes. Another switch 166 allows manual control of clock output line 126 between either high or low conditions when the clock is stopped by switch 165 being in the stop position, as during testing or debugging of various portions of the circuitry of this invention.

Microcomputer 89 is an 8-bit microprocessor, such as type MC6800 commercially available from Motorola Corporation of Phoenix, Ariz.

Figure 16:
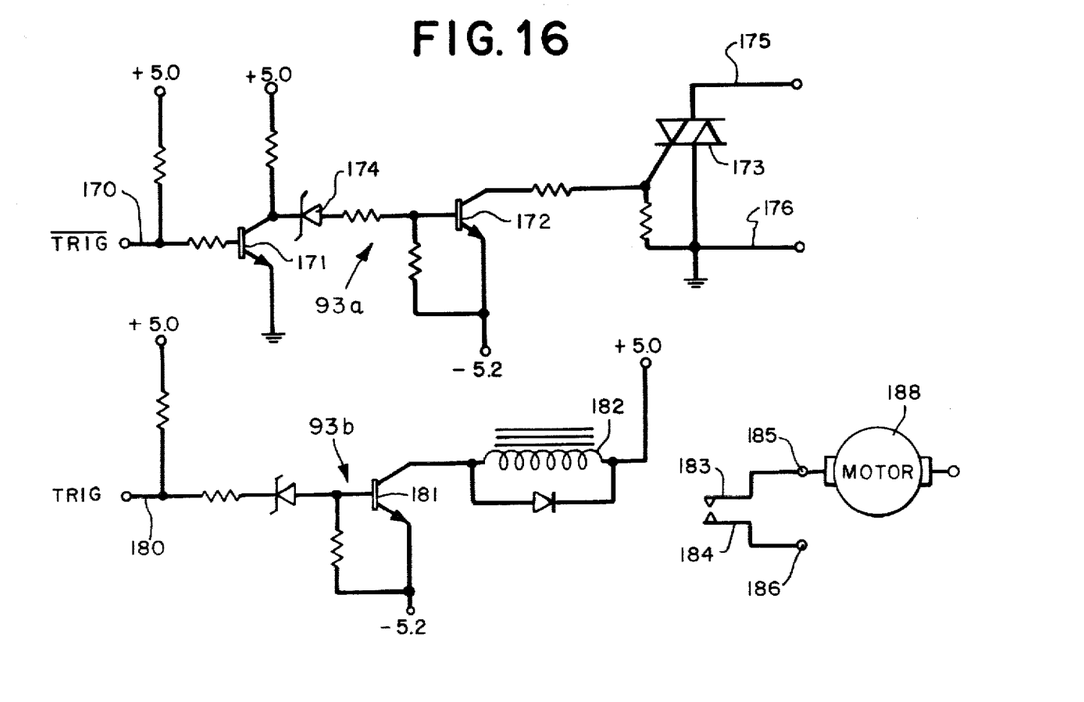
FIG. 16 is a schematic diagram of output driving and controlling circuitry useful in the system of FIG. 10.

Shown in FIG. 16 are output isolators 93b and output drivers 93a. Output driver 93a is responsive to a low trigger signal on input line 170, which may come from micro-computer 89 as a result of analyzing the Walsh function correlation coefficients generated from signals v(t) and i(t). A low signal on line 170 causes a transistor 171 to assume an OFF condition which in turn causes another transistor 172 to assume a conductive condition to gate a triac 173 into a conductive mode. A zener diode 174 between transistors 171 and 172 protects the collector of transistor 171 from assuming a negative potential due to the negative voltage source at the emitter of transistor 172. A pair of terminals 175 and 176 of a triac 173 may be utilized to activate control, protective, or alarm devices or the like.

Lines 170 and 180 are preferably isolated from microcomputer 89 as by an optically-coupled sensor 187 (FIG. 10) so as to avoid accidental or failure-induced application of A.C. voltage controlled by output driver 93a or output isolator 93b to microcomputer 89.

Where either output isolator 93a or output driver 93b is used as part of an overcurrent relay or fault detecting device, such relay or device may be initially set by information stored in the memory of microcomputer 89, by information externally entered into the system such as from a teletypewriter terminal, or by an analog voltage divider. Similarly, operating time, parameter threshold limits, or time parameter curves may be stored in microcomputer memory for tripping the relay when the time or parameter limits are exceeded.

Output isolator circuit 93b is responsive to a positive trigger signal on a line 180 to render a transistor 181 conductive and thereby energize a coil 182 of a relay to close a pair of electrically isolated contacts 183 and 184 to complete an electrical path between terminals 185 and 186, also for activating control, protective or alarm devices, or to control or interrupt application of power to electrical equipment, such as a motor 188.

Circuits 93a or 93b in combination with opto-isolator 187 and the circuitry of FIG. 8 can form, for example, a time overcurrent relay suitable for a wide variety of applications. Such a combination of circuitry may also be suitable for other time-dependent parameter or function monitoring and/or for power system protection, including for example, conventional metering applications, protecting of multiple phases, simulating a reclosing relay function, or providing selectable and adjustable reset characteristics including instantaneous and decaying exponential types. Any time-parameter curve can be implemented and high accuracy can be maintained over long operating times. The accuracy for long periods of time and the selectable reset characteristics also provide such a relay with the capability of emulating thermal characteristics for the protection of electrical equipment, such as motors or cables, from overheating.

Figure 9:
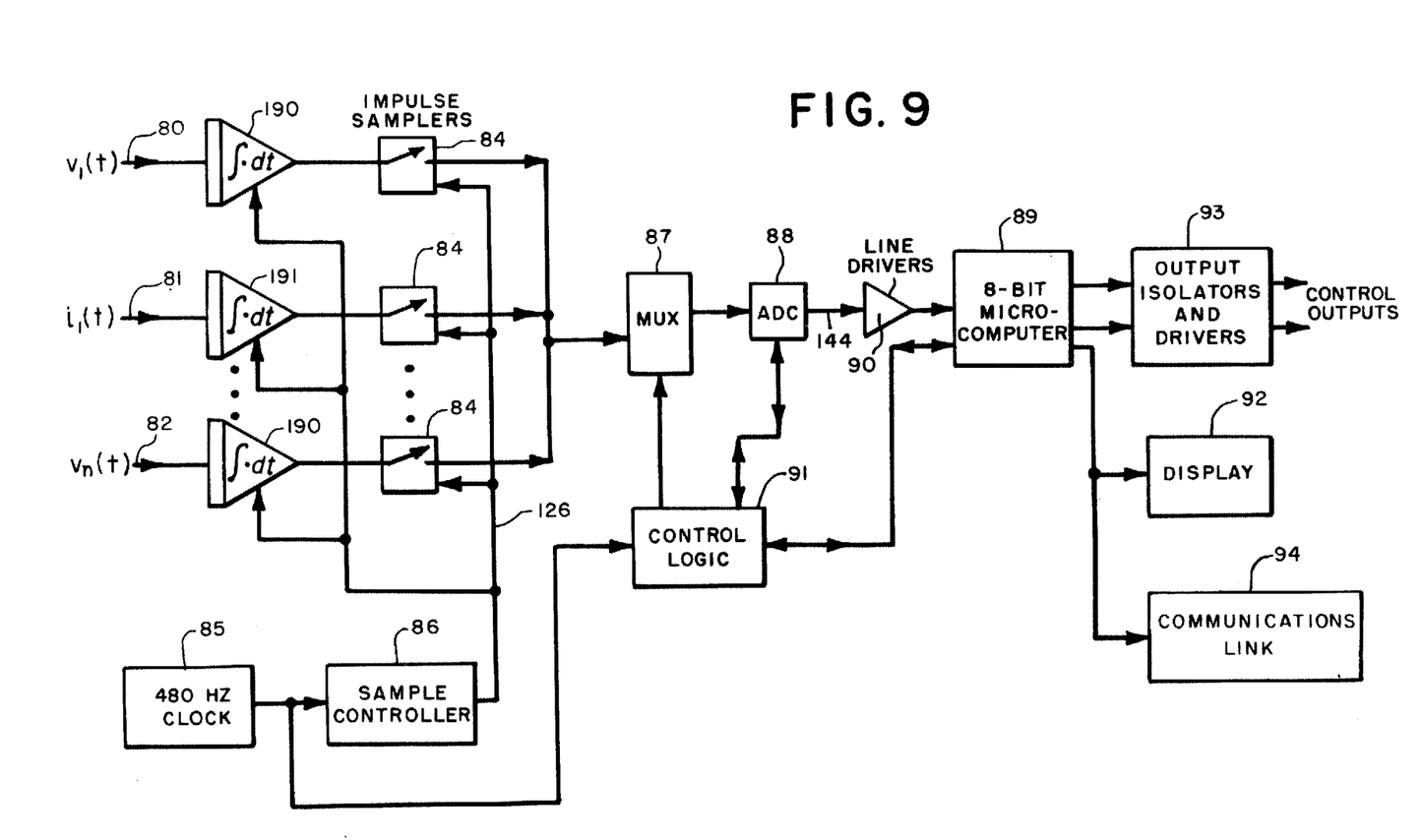
FIG. 9 is a functional block diagram of a system similar to the system of FIG. 8 but providing for a different type of finite-duration impulse-response filtering of the proportional voltage and current signals of FIGS. 7a and 7b.

An alternate embodiment of the circuitry of the invention is illustrated in FIG. 9, which is essentially the same as FIG. 8 except for a different type of finite-duration impulse-response filtering. Instead of low-pass filtering the signals v(t) and i(t), as by low-pass filters 83 in FIG. 8, the circuitry of FIG. 9 utilizes an integrator 190 in each of channels 80 and 81. Signals v(t) or i(t) are integrated over one sample period before being sampled by sample and hold circuits 84. Immediately after sampling the integrator output, integrator 190 is reset by a signal on line 126 to zero initial conditions and begins integrating signal v(t) or i(t) over the next sample period. This type of integrate, sample and dump signal processing eliminates the need for an anti-aliasing filter. Integrator 190 may be simply implemented by an operational amplifier with a capacitive feedback path and means to discharge the capacitor to reset the integrator to zero initial conditions.

The circuits of FIGS. 8 and 9 both have high D.C. signal component rejection such as any D.C. offset in A.C. signals v(t) and i(t). Small amounts of electrical noise and phase jitter have only negligible effects on the accuracy of the circuits in monitoring signals v(t) or i(t), especially at typical amplifier noise levels.

It will be apparent to those skilled in the art that the features and advantages of the present invention could also be implemented by analog circuitry. However, the preferred embodiment of the invention utilizes digital circuitry to process and analyze the power system analog signals v(t) and i(t) since greater accuracy may be obtained.

It will be further appreciated that potential transformer PT and current transformer CT may have digital instead of analog outputs, in which case, a digital integrator may be utilized. This eliminates the need for analog-to-digital conversion and results in even greater system accuracy since charge leakage and offset problems associated with analog integrators are avoided. The practical period of integration may therefore also be substantially extended. Digital filtering further eliminates any D.C. signal components and reduces sensitivity to transients.

Inherent in the preceding description are methods of electronically metering and monitoring an A.C. electrical power system. The first step is sensing the voltage and current in the power system to provide at least one voltage output signal proportional to the voltage of the system and at least one current output signal proportional to the current in the system. Preferably, the sensing step also provides isolation between the A.C. power system and the electronic metering circuitry. The next step is to separately filter the respective proportional current and voltage signals with finite-duration impulse-response filters. This step may be performed in two different ways. One way is to separately filter each voltage or current output signal with a low-pass filter to filter frequencies significantly higher than the frequency of the power system from the respective output signals, sample the low-pass filtered signals a plurality of times during each period of the power system, and hold the sampled output signal for a predetermined time interval. Another way to separately filter the respective output signals with finite-duration impulse-response filters is to separately integrate each output signal with an integrator at least once during each period of the power system, sample the integrated output signal at the completion of each integrating step, hold the sampled signal for a predetermined time interval, and reset the integrator to zero initial conditions at the completion of the integrating step. The outputs of the sampling process are then preferably multiplexed into a single data channel. The multiplexed signals are then converted from analog to digital representations and stored in a memory in sequency with the multiplexer. The present and a plurality of immediately preceding representations of any proportional voltage or current signal which has been stored in memory may then be appropriately added or subtracted to yield the Walsh function correlation coefficients for that particular voltage or current signal. These correlation coefficients are finite-duration impulse-response filtered versions of the isolated voltage and current inputs. The Walsh function correlation coefficients may then be further combined to yield any of a number of power system factors, such as real power, reactive power, voltage, current, or power factor. Additional control or monitoring functions may then be implemented to be responsive to the power system factor determined from the Walsh function correlation coefficients.

While particular embodiments of the invention have been shown and described, it will be obvious to those skilled in the art that changes and modifications may be made without departing from the invention in its broader aspects, and, therefore, the aim of the appended claims is to cover all such changes and modifications as fall within the true spirit and scope of the invention.

I claim:

1. A metering system for electronically metering an A.C. electrical power system of predetermined frequency to determine real and reactive power in the system, said metering system comprising:
   voltage sensing means adapted to sense voltage in the power system, said voltage sensing means further adapted to provide an output signal proportional to said voltage;
   current sensing means adapted to sense current in the power system, said current sensing means further adapted to provide an output signal proportional to said current;
   first and second filtering means for separately sampling respective ones of said voltage and current output signals at least once during each period of said power system to develop respective Walsh function correlation coefficient output signals for each of said voltage and current output signals; and
   combining means for combining said Walsh function correlation coefficient output signals to determine real and reactive power parameters of the power system.

2. A metering system as defined in claim 1 wherein said filtering means separately sample the respective voltage or current output signals a plurality of times during each period of said power system to develop a present and a plurality of immediately preceding Walsh function correlation coefficient signals during each power system period,
said metering system further comprising memory means for storing the present and a plurality of immediately preceding Walsh function correlation coefficient signals;
said combining means adapted to combine the present and the plurality of immediately preceding Walsh function correlation coefficient signals to determine said power system parameters.

3. A metering system as defined in claim 2 further comprising multiplexing means interposed between a plurality of said filtering means and said memory means for multiplexing a plurality of said Walsh function correlation coefficient signals from said plurality of filtering means to a single memory means.

4. A metering system as defined in claim 2 further comprising analog-to-digital conversion means interposed between said filtering means and said memory means for converting each of said Walsh function correlation coefficient signals from an analog form to a digital signal before storage of the digital signals in said memory means.

5. A metering system as defined in claim 4 wherein said memory means and said combining means comprise digital processor means for storing each successive digital signal from said analog-to-digital conversion means, said digital processor means further selectively positively or negatively adding a present and a plurality of immediately preceding digital signals to thereby determine said real and reactive power parameters of the power system.

6. A metering system as defined in claim 1 further comprising display means for displaying said power system parameter determined by said metering system.

7. A metering system as defined in claim 1 further comprising control means responsive to any irregularity in the power system parameter determined by said metering system said control means further adapted to interrupt said power system upon the occurrence of said iregularity.

8. A metering system as defined in claim 1 wherein said filtering means comprises:
   separate low-pass filter means for separately filtering frequencies higher than the power system frequency from each of said voltage and current output signals to provide respective filtered voltage and current output signals; and
   sample and hold means for periodically sampling each filtered voltage and current output signal from each of said low-pass filter means at least once during each period of said power system to provide respective sampled voltage and current output signals, said sample and hold means holding the sampled output signals for a predetermined time interval.

9. A metering system for electronically metering an A.C. electrical power system of predetermined frequency to determine real and reactive power in the system, said system further including voltage sensing means for sensing voltage in the power system and providing a voltage output signal proportional to said voltage and current sensing means for sensing current in the power system and providing a current output signal proportional to the current in the power system, said metering system comprising:
   filtering means for separately sampling respective ones of said voltage and current output signals at least once during each period of said power system to develop respective Walsh function correlation coefficient output signals for each of said voltage and current output signals, said filtering means including:

first and second integrating means responsive to respective output signals of said voltage and current sensing means for integrating the voltage and current output signals therefrom at least once during each period of said power system, each of said integrating means providing a respective integrated output signal;

sample and hold means for periodically and independently sampling the integrated output signals of said first and second integrating means, said sample and hold means further providing a sampled output signal and holding said sampled output signal for a predetermined time interval;

resetting means for resetting said first and second integrating means to initial conditions after sampling said respective integrated output signals; and said metering system further comprising combining means for combining said Walsh function correlation coefficient output signals to determine real and reactive power parameters of the power system.

10. A method of metering an A.C. electrical power system to determine real and reactive power parameters therein, said power system including voltage sensing means for sensing voltage in the power system and providing at least one voltage output signal proportional to voltage in said system, said system further including current sensing means for sensing current in the power system and providing at least one current output signal proportional to current in said system, said method comprising the steps of:

filtering said at least one voltage output signal with a finite-duration impulse-response filter at least once during each period of the power system to periodically develop a Walsh function correlation coefficient output signal for each of said at least one voltage output signal;

filtering said at least one current output signal with a finite-duration impulse-response filter at least once during each period of the power system to periodically develop a Walsh function correlation coefficient output signal for each of said at least one current output signal;

storing the periodically developed Walsh function correlation coefficient voltage and current output signals in a memory means; and combining a present and a plurality of immediately preceding Walsh function correlation coefficient voltage and current output signals in said memory means to determine real and reactive parameters of the power system.

11. A method as defined in claim 10 wherein filtering by finite-duration impulse-response filters includes the steps of:

separately low-pass filtering respective ones of said voltage and current output signals with separate low-pass filter means to filter frequencies significantly higher than said predetermined power system frequency from respective ones of said voltage and current output signals, said filter means providing respective filtered voltage and current output signals;

sampling and holding respective ones of the filtered voltage and current output signals from said low-pass filter means at least once during each period of said power system for providing respective sampled voltage and current output signals; and holding respective ones of the sampled output signals for a predetermined time interval.

12. A method as defined in claim 10 further comprising an additional step of multiplexing each of said sampled voltage and current output signals from each finite-duration impulse-response filter with multiplexer means for storage of said sampled output signals in a single memory means.

13. A method as defined in claim 12 comprising an additional step of successively converting multiplexed signals from said multiplexer means from an analog form to a digital form before storing the converted digital signals in said memory means.

14. A method as defined in claim 13 comprising an additional step of interrupting said power system by a relay means interposed in said power system and responsive to the digital signals stored in said memory means when said signals indicate the existence of an overcurrent or fault condition in said power system.

15. An overcurrent relay for responding to an overcurrent or fault condition in an A.C. electrical power system to interrupt said power system upon the occurrence of said overcurrent or fault condition, said overcurrent relay comprising:

current sensing means adapted to sense current in the power system, said current sensing means further adapted to provide an output signal proportional to said current;

filtering means for sampling said current output signal at least once during each period of said power system to develop a Walsh function correlation coefficient output signal for said current output signal;

memory means for storing a present and a plurality of immediately preceding Walsh function correlation coefficient signals;

combining means adapted to combine the present and the plurality of immediately preceding Walsh function correlation coefficient signals to determine a power system parameter; and relay means interposed in said power system and responsive to the power system parameter determined by said combining means to interrupt said power system when said power system parameter indicates the existence of an overcurrent or a fault condition.

16. An overcurrent relay as defined in claim 15 further comprising analog-to-digital conversion means interposed between said filter means and said memory means for converting said Walsh function correlation coefficient signals from an analog form to a digital signal before storage of the digital signals in said memory means.

17. An overcurrent relay as defined in claim 16 wherein said memory means and said combining means comprise digital processor means for storing each successive digital signal from said analog-to-digital conversion means, said digital processor means further selectively positively or negatively adding a present and a plurality of immediately preceding digital signals to thereby determine said power system parameter.

18. A metering system for electronically metering an A.C. electrical power system of predetermined frequency to determine real and reactive power in the system, said metering system comprising:

voltage sensing means adapted to sense voltage in the power system, said voltage sensing means further adapted to provide an output signal proportional to said voltage;

current sensing means adapted to sense current in the power system, said current sensing means further adapted to provide an output signal proportional to said current;

first and second filtering means for separately sampling respective ones of said voltage and current output signals at least once during each period of said power system to develop respective Walsh function correlation coefficient output signals for each of said voltage and current output signals;

said filtering means including first and second integrating means responsive to respective output signals of said voltage and current sensing means for integrating the voltage and current output signals therefrom at least once during each period of said power system, each of said integrating means providing a respective integrated output signal, sample and hold means for periodically and independently sampling said integrated output signals, said sample and hold means further providing a sampled output signal and holding said sampled output signal for a predetermined time interval, and resetting means for resetting said integrating means to initial conditions after sampling said respective integrated output signals; and combining means for combining said Walsh function correlation coefficient output signals to determine the real and reactive power parameters of the power system.

19. A metering system as defined in claim 18 wherein said filtering means further comprise:

analog memory means for storing a present and a predetermined number of immediately preceding sampled voltage and current output signals from said sample and hold means; and a plurality of summing amplifiers for positively or negatively summing each of the present and immediately preceding sampled output signals in said analog memory means, said summing amplifiers each providing a signal related in magnitude to a Walsh function correlation coefficient of the voltage or current in said power system.

20. A metering system for electronically metering an A.C. electrical power system of predetermined frequency to determine real and reactive power in the system, said metering system comprising:

voltage sensing means adapted to sense voltage in the power system, said voltage sensing means further adapted to provide an output signal proportional to said voltage;

current sensing means adapted to sense current in the power system, said current sensing means further adapted to provide an output signal proportional to said current;

first and second filtering means for separately sampling respective ones of said voltage and current output signals at least once during each period of said power system to develop respective Walsh function correlation coefficient output signals for each of said voltage and current output signals;

combining means comprising a plurality of analog multiplier means, said analog multiplier means each multiplying a pair of said Walsh function correlation coefficient output signals from said filtering means and providing an output signal related in magnitude to the pairs of multiplied Walsh function correlation coefficient output signals; and summing and scaling amplifier means for positively or negatively summing each of the output signals of said analog multiplier means and for scaling the resultant sum by an appropriate gain factor to provide an output signal related in magnitude to the real or reactive power in the system.

21. A method of metering an A.C. electrical power system to determine real and reactive power parameters therein, said power system including voltage sensing means for sensing voltage in the power system and providing at least one voltage output signal proportional to voltage in said system, said system further including current sensing means for sensing current in the power system and providing at least one current output signal proportional to current in said system, said method comprising the steps of:

filtering said at least one voltage output signal with a finite-duration impulse-response filter at least once during each period of the power system to periodically develop a Walsh function correlation coefficient output signal for each of said at least one voltage output signal;

filtering said at least one current output signal with a finite-duration impulse-response filter at least once during each period of the power system to periodically develop a Walsh function correlation coefficient output signal for each of said at least one current output signal;

said filtering including separately integrating respective ones of said voltage and current output signals with respective first and second integrating means at least once during each period of said power system, said first and second integrating means providing respective integrated voltage and current output signals, separately and periodically sampling each integrated voltage and current output signal with sample and hold means for providing respective sampled voltage and current output signals, holding each of the sampled voltage and current output signals with holding means for a predetermined time interval, and resetting each of said first and second integrating means to initial conditions after sampling each of said integrated voltage and current output signals;

storing the periodically developed Walsh function correlation coefficient voltage and current output signals in a memory means; and combining a present and a plurality of immediately preceding Walsh function correlation coefficient voltage and current output signals in said memory means to determine real and reactive parameters of the power system.

22. An overcurrent relay for responding to an overcurrent or fault condition in an A.C. electrical power system to interrupt said power system upon the occurrence of said overcurrent or fault condition, said overcurrent relay comprising:

current sensing means adapted to sense current in the power system, said current sensing means further adapted to provide an output signal proportional to said current;

filtering means for sampling said current output signal at least once during each period of said power system to develop a Walsh function correlation coefficient output signal for said current output signal;

said filtering means comprising integrating means responsive to the output signal of said current sensing means for integrating the current output signal therefrom at least once during each period of said power system, said integrating means providing an integrated output signal, sample and hold means for periodically sampling the integrated output signal of said integrating means, said sample and hold means further providing a sampled output signal and holding said sampled output signal for a predetermined time interval, and resetting means for resetting said integrating means to initial conditions after sampling said integrated output signal;

memory means for storing a present and a plurality of immediately preceding Walsh function correlation coefficient signals;

combining means adapted to combine the present and the plurality of immediately preceding Walsh function correlation coefficient signals to determine a power system parameter; and relay means interposed in said power system and responsive to the power system parameter determined by said combining means to interrupt said power system when said power system parameter indicates the existence of an overcurrent or a fault condition.

* * * * *